United States Patent
Lin et al.

(10) Patent No.: US 10,256,160 B1
(45) Date of Patent: Apr. 9, 2019

(54) METHOD FOR PROTECTING EPITAXIAL LAYER BY FORMING A BUFFER LAYER ON NMOS REGION

(71) Applicant: UNITED MICROELECTRONICS CORP., Hsin-Chu (TW)

(72) Inventors: Chun-Hao Lin, Kaohsiung (TW); Hsin-Yu Chen, Nantou County (TW); Shou-Wei Hsieh, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/786,608

(22) Filed: Oct. 18, 2017

(30) Foreign Application Priority Data

Sep. 22, 2017 (CN) .......................... 2017 1 0864853

(51) Int. Cl.
| | |
|---|---|
| *H01L 21/8238* | (2006.01) |
| *H01L 29/161* | (2006.01) |
| *H01L 27/092* | (2006.01) |
| *H01L 29/66* | (2006.01) |

(52) U.S. Cl.
CPC ............... *H01L 21/823864* (2013.01); *H01L 21/823814* (2013.01); *H01L 21/823821* (2013.01); *H01L 21/823871* (2013.01); *H01L 27/0924* (2013.01); *H01L 29/161* (2013.01); *H01L 29/66545* (2013.01)

(58) Field of Classification Search
CPC .................... H01L 21/8238–21/823892; H01L 27/092–27/0928; H01L 29/04–29/045; H01L 29/16–29/1608; H01L 29/18–29/185; H01L 29/22–29/2206; H01L 29/36–29/365; H01L 21/823857; H01L 21/823864; H01L 21/823814; H01L 21/823821; B81C 2203/0728; B81C 2203/0735; B81C 2203/0742
See application file for complete search history.

(56) References Cited

U.S. PATENT DOCUMENTS

| | | | |
|---|---|---|---|
| 8,900,957 B2 | 12/2014 | Chung et al. | |
| 9,679,977 B2 | 6/2017 | Kim et al. | |
| 2007/0096195 A1* | 5/2007 | Hoentschel | ..... H01L 21/823807 257/315 |
| 2013/0252387 A1* | 9/2013 | Tsai | ................ H01L 21/823807 438/231 |

* cited by examiner

Primary Examiner — Tucker J Wright
(74) Attorney, Agent, or Firm — Winston Hsu

(57) ABSTRACT

A method for fabricating semiconductor device includes the steps of: providing a substrate having a first region and a second region; forming a first gate structure on the first region and a second gate structure on the second region; forming a first spacer around the first gate structure; forming a first epitaxial layer adjacent to two sides of the first spacer; forming a buffer layer on the first gate structure; and forming a contact etch stop layer (CESL) on the buffer layer on the first region and the second gate structure on the second region.

7 Claims, 6 Drawing Sheets

US 10,256,160 B1

METHOD FOR PROTECTING EPITAXIAL LAYER BY FORMING A BUFFER LAYER ON NMOS REGION

BACKGROUND OF THE INVENTION

1. Field of the Invention

The invention relates to a method for fabricating semiconductor device, and more particularly, to a method of protecting epitaxial layer during etching process by forming a buffer layer on a NMOS region.

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

However, in current fabrication of high-k metal transistor, particularly during the fabrication of a CMOS device, the epitaxial layer adjacent to two sides of the gate structure on either NMOS region or PMOS region is often damaged by etchant so that the performance of the device is degraded. Hence how to resolve this issue has become an important task in this field.

SUMMARY OF THE INVENTION

According to an embodiment of the present invention, a method for fabricating semiconductor device includes the steps of: providing a substrate having a first region and a second region; forming a first gate structure on the first region and a second gate structure on the second region; forming a first spacer around the first gate structure; forming a first epitaxial layer adjacent to two sides of the first spacer; forming a buffer layer on the first gate structure; and forming a contact etch stop layer (CESL) on the buffer layer on the first region and the second gate structure on the second region.

According to another aspect of the present invention, a semiconductor device includes: a substrate having a first region and a second region; a first gate structure on the first region; a first spacer around the first gate structure; a first epitaxial layer adjacent to two sides of the first spacer; a buffer layer on the first epitaxial layer and the first spacer; and a contact etch stop layer (CESL) on the buffer layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
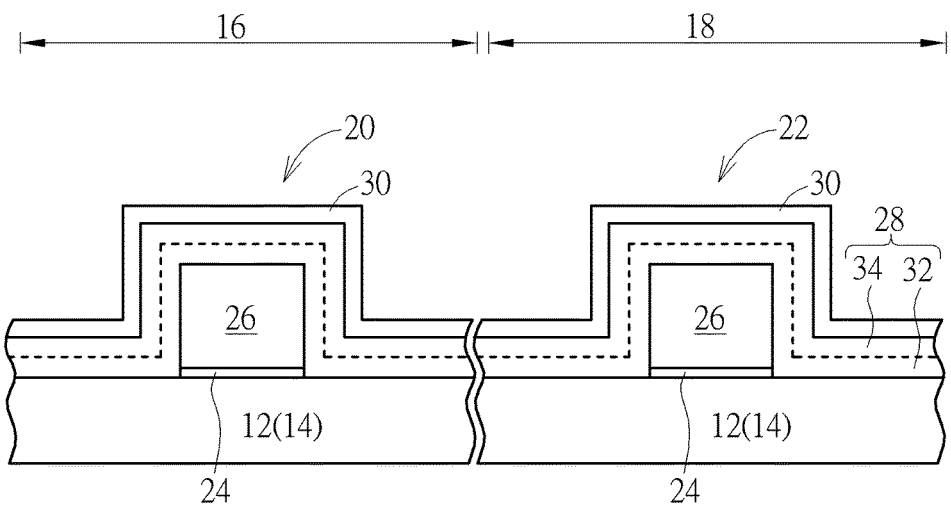
FIGS. 1-11 illustrate a method for fabricating a semiconductor device according to an embodiment of the present invention.

Referring to FIGS. 1-11, FIGS. 1-11 illustrate a method for fabricating a semiconductor device according to an embodiment of the present invention. As shown in FIG. 1, a substrate 12, such as a silicon substrate or silicon-on-insulator (SOI) substrate is first provided, and at least a transistor region such as a first region and a second region are defined on the substrate 12. In this embodiment, the first region is preferably a NMOS region 16 while the second region is a PMOS region 18. Next, at least a fin-shaped structure 14 is formed on the substrate 12, in which the bottom of the fin-shaped structure 14 is surrounded by an insulating layer or shallow trench isolation (STI) made of material including but not limited to for example silicon oxide. It should be noted that even though this embodiment pertains to the fabrication of a non-planar FET device such as FinFET device, it would also be desirable to apply the following processes to a planar FET device, which is also within the scope of the present invention.

According to an embodiment of the present invention, the fin-shaped structure 14 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structure 14 could also be obtained by first forming a patterned mask (not shown) on the substrate, 12, and through an etching process, the pattern of the patterned mask is transferred to the substrate 12 to form the fin-shaped structure. Moreover, the formation of the fin-shaped structure could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure. These approaches for forming fin-shaped structure are all within the scope of the present invention.

Next, at least a gate structure 20 or dummy gate is formed on the NMOS region 16 and at least a gate structure 22 or dummy gate is formed on the PMOS region 22. In this embodiment, the formation of the gate structures 20, 22 could be accomplished by a gate first process, a high-k first approach from gate last process, or a high-k last approach from gate last process. Since this embodiment pertains to a high-k last approach, a gate dielectric layer 24 or interfacial layer, a gate material layer 26 made of polysilicon, and a selective hard mask could be formed sequentially on the substrate 12, and a photo-etching process is then conducted by using a patterned resist (not shown) as mask to remove part of the gate material layer 26 and part of the gate dielectric layer 24 through single or multiple etching processes. After stripping the patterned resist, gate structures 20, 22 composed of patterned gate dielectric layer 24 and patterned gate material layer 26 are formed on the substrate 12.

Next, a cap layer 28 is formed on the gate structures 20, 22 and fin-shaped structures 14 on the NMOS region 16 and PMOS region 18, and a first mask layer 30 is formed on the cap layer 28. In this embodiment, the cap layer 28 preferably includes a composite structure, which could further include a first cap layer 32 and a second cap layer 34, in which the first cap layer 32 and the second cap layer 34 preferably include same material such as but not limited to for example silicon oxycarbonitride (SiOCN). Moreover, the first cap layer 32 and the second cap layer 34 preferably include different thicknesses. For instance, the thickness of the first cap layer 32 is approximately 30 Angstroms while the thickness of the second cap layer 34 is approximately 40 Angstroms. The cap layer 32 and the first mask layer 30 are preferably made of different material. For instance the first mask layer 30 in this embodiment preferably includes silicon nitride and the thickness of the first mask layer 30 is about 80 Angstroms, but not limited thereto.

Figure 2:
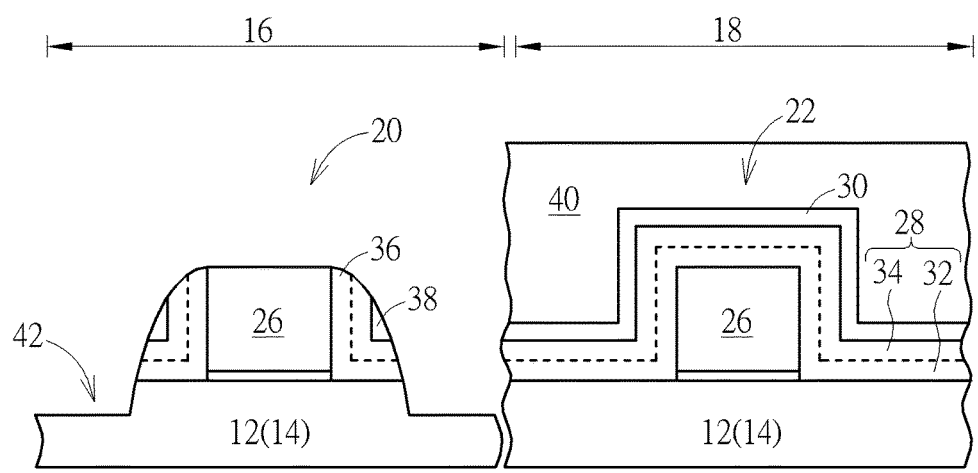

Next, as shown in FIG. 2, part of the first mask layer 30 and part of the cap layer 28 are removed to form spacers 36 and 38 on the NMOS region 16. In this embodiment, the formation of the spacers 36, 38 could be accomplished by first forming a patterned mask such as a patterned resist 40 on the PMOS region 18, and then an etching process is conducted by using the patterned resist 40 as mask to remove part of the first mask layer 30 and part of the cap layer 28 on the NMOS region 16 to form spacers 36, 38 on the sidewalls of the gate structure 20. Next, another etching process is conducted to remove part of the fin-shaped structure 14 on the NMOS region 16 to form a recess 42 adjacent two sides of the gate structure 20, and the patterned resist 40 on the PMOS region 18 is stripped thereafter.

Figure 3:
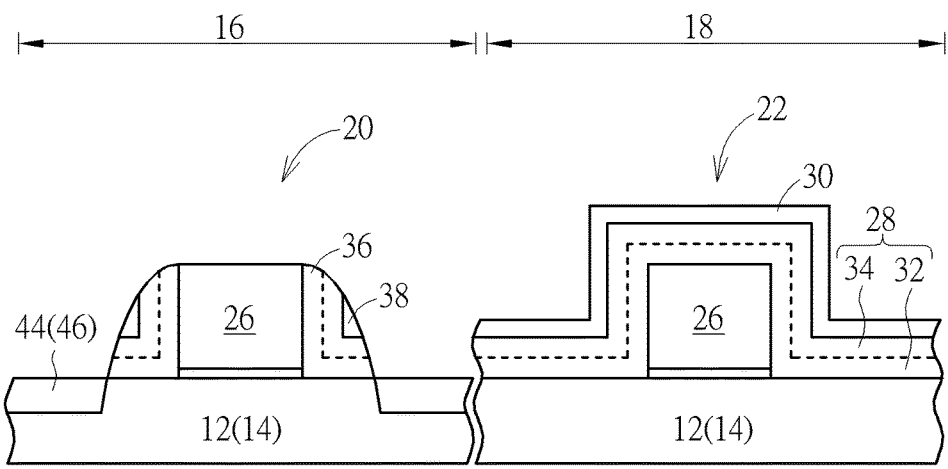

Next, as shown in FIG. 3, a selective epitaxial growth (SEG) process is conducted to form an epitaxial layer 44 and source/drain region 46 in the recess 42 on the NMOS region 16. In this embodiment, the epitaxial layer 44 could include SiP, but not limited thereto.

Figure 4:
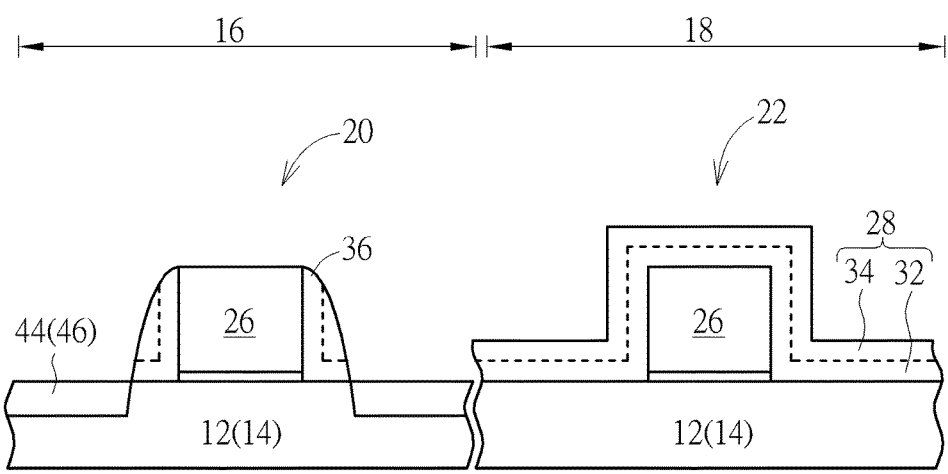

Next, as shown in FIG. 4, an etching process is conducted to remove the first mask layer 30, including the spacer 38 that has been transformed from the first mask layer 30 on NMOS region 16 and the entire first mask layer 30 on PMOS region 18.

Figure 5:
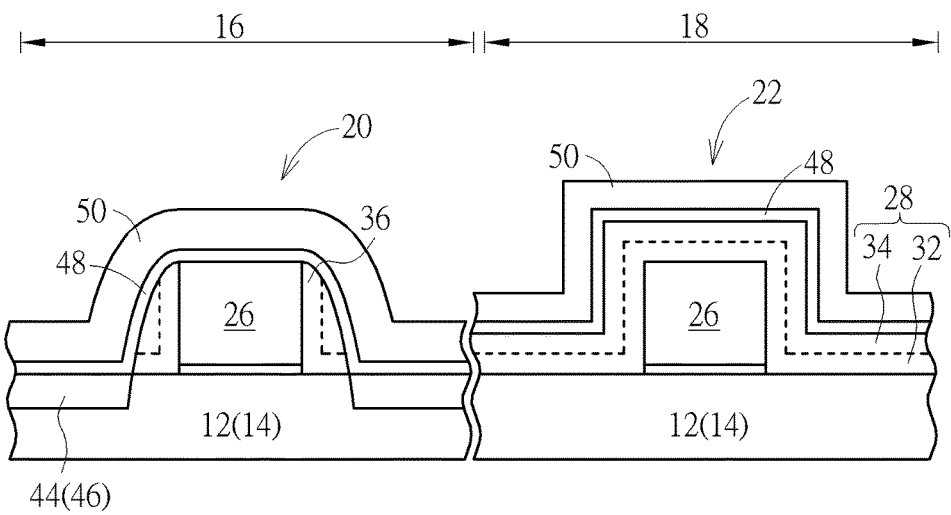

Next, as shown in FIG. 5, a buffer layer 48 is formed on the gate structure 20 on the NMOS region 16 and the cap layer 28 on the PMOS region 18, and a second mask layer 50 is formed on the buffer layer 48 afterwards. In this embodiment, the buffer layer 48 is preferably made of SiOCN having a thickness of approximately 30 Angstroms and the second mask layer 50 is made of SiN having a thickness of approximately 65 Angstroms, but not limited thereto.

Figure 6:
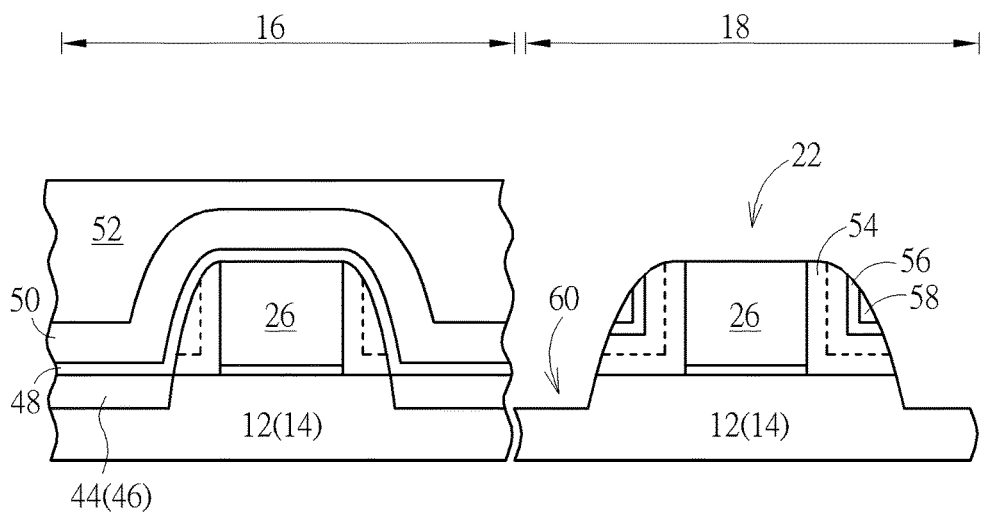

Next, as shown in FIG. 6, a patterned mask such as a patterned resist 52 is formed on the NMOS region 16, and an etching process is conducted by using the patterned resist 52 as mask to remove part of the second mask layer 50, part of the buffer layer 48, and part of the cap layer 28 on the PMOS region 18 to form spacer 54, spacer 56, and spacer 58 around the gate structure 22. Next, another etching process is conducted to remove part of the fin-shaped structure 14 on the PMOS region 18 to form a recess 60 adjacent to two sides of the gate structure 22. The patterned resist 52 is removed thereafter.

Figure 7:
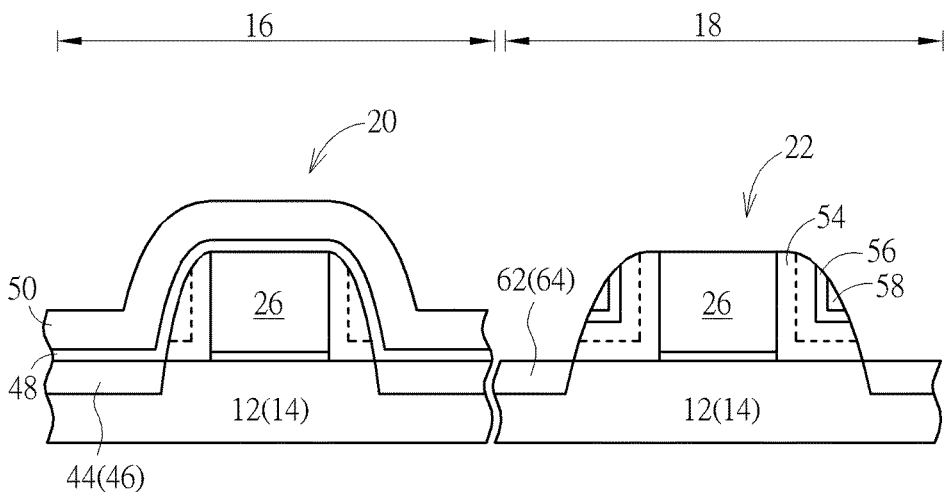

Next, as shown in FIG. 7, a selective epitaxial growth process is conducted to form an epitaxial layer 62 and source/drain region 64 in the recess 60. In this embodiment, the epitaxial layer 62 could include silicon germanium (SiGe), but not limited thereto.

Figure 8:
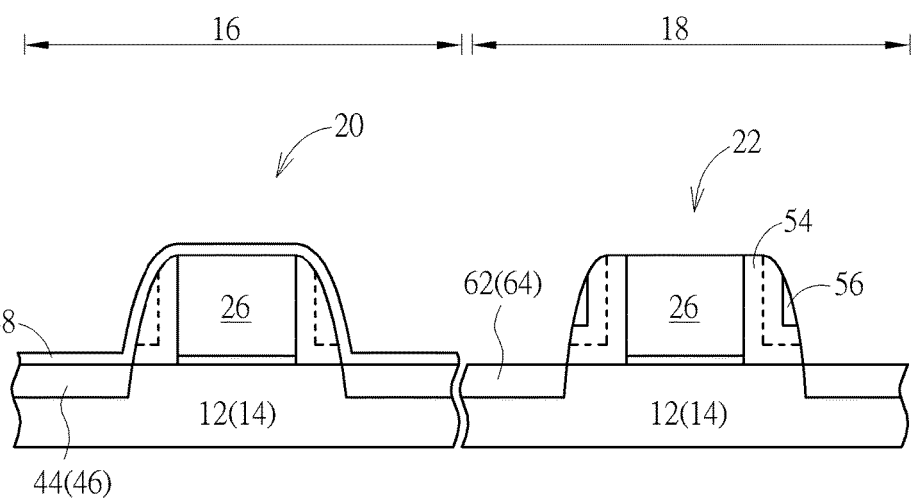

Next, as shown in FIG. 8, the second mask layer 50 on the NMOS region 16 and PMOS region 18, including the entire second mask layer 50 on the NMOS region 16 and the spacer 58 that was transformed from the second mask layer 50 are removed. It should be noted that since the buffer layer 48 is used as a protective film on the NMOS region 16 during the removal of the second mask layer 50, the epitaxial layer 44 preferably made of SiP adjacent to two sides of the gate structure 20 is protected by the buffer layer 48 so that epitaxial layer 44 would be lost from damages caused by etchant such as phosphoric acid.

Figure 9:
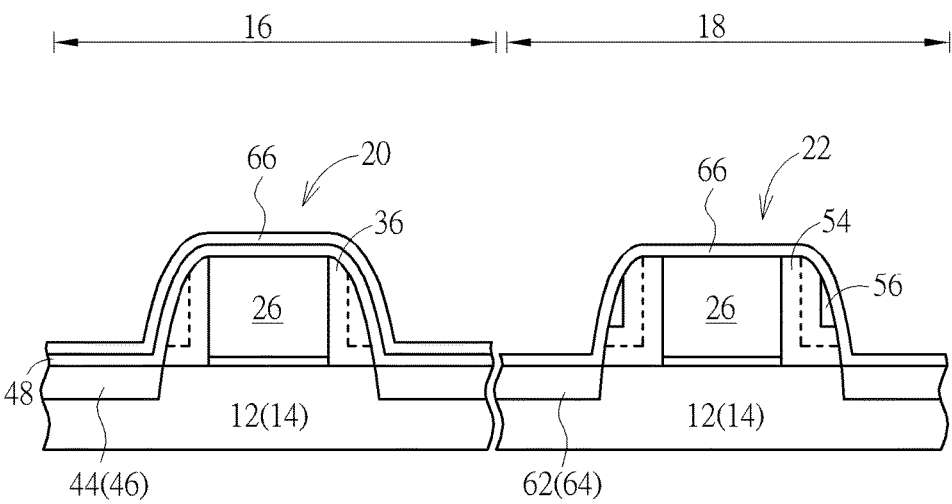

Next, as shown in FIG. 9, a contact etch stop layer (CESL) 66 is formed on the NMOS region 16 and PMOS region 18, in which the CESL 66 on the NMOS region 16 preferably covers the surface of the buffer layer 48 while the CESL 66 on the PMOS region 18 covers the surface of the epitaxial layer 62 and contacting the gate structure 22 directly. In this embodiment, the CESL 66 and the buffer layer 48 are preferably made of different material. For instance, the CESL 66 in this embodiment is preferably made of silicon nitride (SiN), but could also be made of other dielectric material having stress including but not limited to for example SiCN. Nevertheless, according to an embodiment of the present invention, the CESL 66 and the buffer layer 48 could also be made of same material such as SiOCN, which is also within the scope of the present invention.

Figure 10:
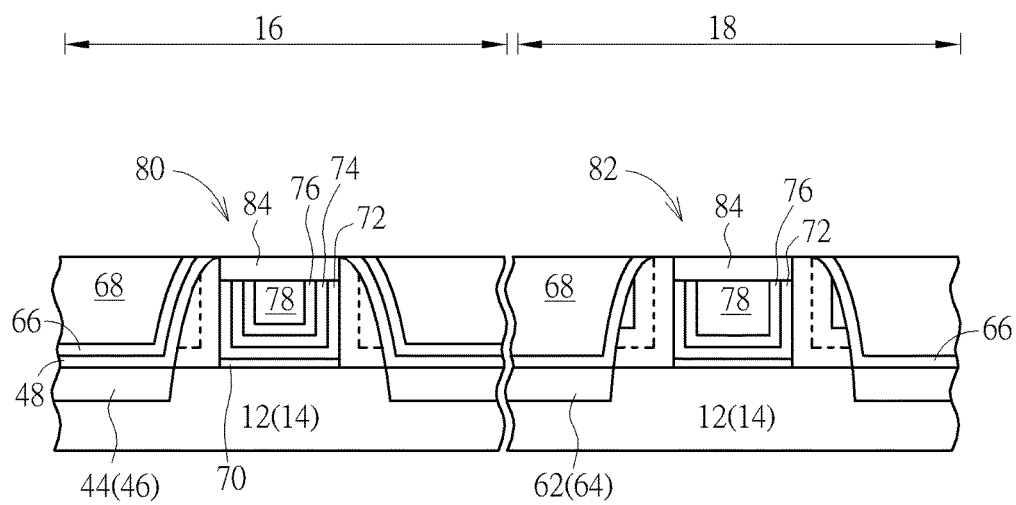

Next, as shown in FIG. 10, an interlayer dielectric (ILD) layer 68 is formed on the CESL 66, and a planarizing process such as chemical mechanical polishing (CMP) process is conducted to remove part of the ILD layer 68 and part of the CESL 66 to expose the gate material layer 26 made of polysilicon, in which the top surfaces of the gate material layer 26 and the ILD layer 68 are coplanar.

Next, a replacement metal gate (RMG) process is conducted to transform the gate structure 20 on the NMOS region 16 and the gate structure 22 on the PMOS region 18 into metal gates. For instance, the RMG process could be accomplished by first performing a selective dry etching or wet etching process using etchants including but not limited to for example ammonium hydroxide ($NH_4OH$) or tetramethylammonium hydroxide (TMAH) to remove the gate material layer 26 and even gate dielectric layer 24 from gate structures 20, 22 for forming a recess (not shown) in the ILD layer 68 on the NMOS region 16 and PMOS region 18. Next, a selective interfacial layer or gate dielectric layer 70, a high-k dielectric layer 72, a selective barrier layer (not shown), and a work function metal layer 74 are formed in each of the recesses on NMOS region 16 and PMOS region 18, another patterned mask (not shown) such as patterned resist is formed to cover the NMOS region 16, an etching process is conducted to remove the work function metal layer 74 on the PMOS region 18, the patterned mask is stripped from the NMOS region 16, and another work function metal layer 76 is formed on both NMOS region 16 and PMOS region 18. Next, a selective barrier layer (not shown) such as a top barrier metal (TBM) and a low resistance metal layer 78 are formed in the recesses, and a planarizing process such as CMP is conducted to form metal gates 80, 82 on the NMOS region 16 and PMOS region 18 respectively.

Next, part of the metal gates 80, 82 are removed to form another recess (not shown) on each of the NMOS region 16, and PMOS region 18, and hard masks 84 made of dielectric material including but not limited to for example silicon nitride is deposited into the recesses so that the top surfaces of the hard masks 84 and ILD layer 68 are coplanar. In this embodiment, the gate structure or metal gate 80 fabricated through high-k last process of a gate last process on the NMOS region 16 preferably includes an interfacial layer or gate dielectric layer 70, a U-shaped high-k dielectric layer 72, a U-shaped work function metal layer 74, another U-shaped work function metal layer 76, and a low resistance metal layer 78. The gate structure or metal gate 82 fabricated through high-k last process of a gate last process on the PMOS region 18 on the other hand includes an interfacial layer or gate dielectric layer 70, a U-shaped high-k dielectric layer 72, a U-shaped work function metal layer 76, and a low resistance metal layer 78.

In this embodiment, the high-k dielectric layer 72 is preferably selected from dielectric materials having dielectric constant (k value) larger than 4. For instance, the high-k dielectric layer 72 may be selected from hafnium oxide (HfO$_2$), hafnium silicon oxide (HfSiO$_4$), hafnium silicon oxynitride (HfSiON), aluminum oxide (Al$_2$O$_3$), lanthanum oxide (La$_2$O$_3$), tantalum oxide (Ta$_2$O$_5$), yttrium oxide (Y$_2$O$_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalate (SrBi$_2$Ta$_2$O$_9$, SBT), lead zirconate titanate (PbZr$_x$Ti$_{1-x}$O$_3$, PZT), barium strontium titanate (Ba$_x$Sr$_{1-x}$TiO$_3$, BST) or a combination thereof.

Preferably, the work function metal layers 74, 76 are formed for tuning the work function of the metal gate in accordance with the conductivity of the device. In this embodiment, the work function metal layer 74 is preferably a n-type work function metal layer having a work function ranging between 3.9 eV and 4.3 eV, which may include titanium aluminide (TiAl), zirconium aluminide (ZrAl), tungsten aluminide (WAl), tantalumaluminide (TaAl), hafniumaluminide (HfAl), or titanium aluminum carbide (TiAlC), or any combination thereof. The work function metal layer 76 on the other hand is a p-type work function metal layer having a work function ranging between 4.8 eV and 5.2 eV, which may include titanium nitride (TiN), tantalum nitride (TaN), tantalum carbide (TaC), or any combination thereof. The material of the low-resistance metal layer 78 may include copper (Cu), aluminum (Al), titanium aluminum (TiAl), cobalt tungsten phosphide (CoWP) or any combination thereof.

Figure 11:
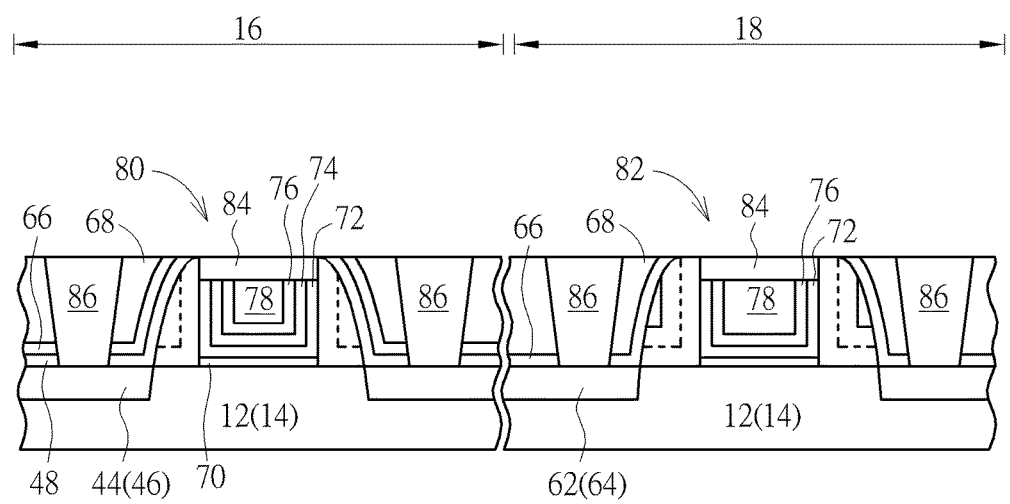

Next, as shown in FIG. 11, a photo-etching process is conducted by using a patterned mask (not shown) as mask to remove part of the ILD layer 68 and part of the CESL 66 adjacent to the metal gates 80, 82 for forming contact holes (not shown) exposing the source/drain regions 46, 64 underneath. Next, metals including a barrier layer selected from the group consisting of Ti, TiN, Ta, and TaN and a low resistance metal layer selected from the group consisting of W, Cu, Al, TiAl, and CoWP are deposited into the contact holes, and a planarizing process such as CMP is conducted to remove part of aforementioned barrier layer and low resistance metal layer for forming contact plugs 86 electrically connecting the source/drain regions 46, 64. This completes the fabrication of a semiconductor device according to a preferred embodiment of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a substrate having a first region and a second region;
    a first gate structure on the first region and a second gate structure on the second region;
    a first spacer around the first gate structure and a second spacer around the second gate structure;
    a first epitaxial layer adjacent to two sides of the first spacer;
    a buffer layer on the first epitaxial layer and the first spacer, wherein the buffer layer comprises a horizontal surface parallel to a top surface of the substrate and the buffer layer and the first spacer comprise a same material; and
    a contact etch stop layer (CESL) on and directly contacting the horizontal surface of the buffer layer and the second spacer.

2. The semiconductor device of claim 1, further comprising:
    a third spacer adjacent to the second spacer;
    a second epitaxial layer adjacent to two sides of the third spacer; and
    the CESL on the second epitaxial layer and the third spacer.

3. The semiconductor device of claim 2, wherein the first spacer and the second spacer comprise a same material.

4. The semiconductor device of claim 2, wherein the buffer layer and the third spacer comprise a same material.

5. The semiconductor device of claim 1, wherein the buffer layer and the CESL comprise different material.

6. The semiconductor device of claim 1, wherein the first region comprises a NMOS region and the second region comprises a PMOS region.

7. The semiconductor device of claim 1, further comprising:
    an interlayer dielectric (ILD) layer on the CESL;
    a first contact plug on the first region and contacting the first epitaxial layer; and
    a second contact plug on the second region and contacting the second epitaxial layer.

* * * * *